United States Patent
Jin et al.

(10) Patent No.: US 8,487,431 B2
(45) Date of Patent: *Jul. 16, 2013

(54) SEMICONDUCTOR INTEGRATED CIRCUIT HAVING A MULTI-CHIP STRUCTURE

(75) Inventors: Sin-Hyun Jin, Gyeonggi-do (KR); Jong-Chern Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 263 days.

This patent is subject to a terminal disclaimer.

(21) Appl. No.: 12/833,436

(22) Filed: Jul. 9, 2010

(65) Prior Publication Data

US 2011/0291266 A1 Dec. 1, 2011

(30) Foreign Application Priority Data

May 27, 2010 (KR) .................. 10-2010-0049727

(51) Int. Cl.
*H01L 23/48* (2006.01)

(52) U.S. Cl.
USPC .... 257/737; 257/686; 257/777; 257/E23.011; 257/E21.506; 438/613; 438/106; 438/108

(58) Field of Classification Search
USPC ............. 257/737, 686, 777, 621, E23.011, 257/E23.021, E21.506; 438/613, 106, 108
See application file for complete search history.

(56) References Cited

U.S. PATENT DOCUMENTS

| 6,278,174 | B1 * | 8/2001 | Havemann et al. ........... 257/637 |
| 6,444,576 | B1 * | 9/2002 | Kong ............................. 438/667 |
| 7,378,702 | B2 * | 5/2008 | Lee ................................ 257/296 |
| 7,400,038 | B2 * | 7/2008 | Sukegawa et al. ............ 257/724 |
| 8,310,033 | B2 * | 11/2012 | Jin et al. ........................ 257/621 |
| 2007/0155048 | A1 | 7/2007 | Lee et al. |
| 2008/0054489 | A1 * | 3/2008 | Farrar et al. ................... 257/777 |
| 2009/0127668 | A1 * | 5/2009 | Choi ............................. 257/621 |
| 2009/0283898 | A1 | 11/2009 | Janzen et al. |
| 2010/0072588 | A1 * | 3/2010 | Yang ............................. 257/676 |
| 2011/0291265 | A1 * | 12/2011 | Jin et al. ........................ 257/737 |

FOREIGN PATENT DOCUMENTS

| JP | 2003-332440 | 11/2003 |
| KR | 1020070112646 | 11/2007 |
| KR | 10 2009 0052617 A | 5/2009 |

OTHER PUBLICATIONS

Notice of Allowance issued by the Korean Intellectual Property Office on Sep. 24, 2012.

* cited by examiner

*Primary Examiner* — Thinh T Nguyen
(74) *Attorney, Agent, or Firm* — IP & T Group LLP

(57) ABSTRACT

A semiconductor integrated circuit having a multi-chip structure includes a plurality of stacked semiconductor chips. At least one of the semiconductor chips includes first and second metal layers separately formed inside the semiconductor chip, a first internal circuit coupled in series between the first and second metal layers inside the semiconductor chip, a first metal path vertically formed over the second metal layer to a first side of the semiconductor chip, and a first through silicon via formed through the semiconductor chip from a second side of the semiconductor chip to the first metal layer.

9 Claims, 7 Drawing Sheets

SEMICONDUCTOR INTEGRATED CIRCUIT HAVING A MULTI-CHIP STRUCTURE

CROSS-REFERENCE TO RELATED APPLICATIONS

The present application claims priority of Korean Patent Application No. 10-2010-0049727, filed on May 27, 2010, which is incorporated herein by reference in its entirety.

BACKGROUND OF THE INVENTION

Exemplary embodiments of the present invention relate to a semiconductor integrated circuit having a multi-chip structure, and more particularly, to a semiconductor integrated circuit in which an internal circuit of each semiconductor chip is coupled in series to a through silicon via (TSV).

In the semiconductor industry, packaging technology for integrated circuits has been continuously developed to satisfy demands for miniaturization and mounting reliability. For example, the demand for miniaturization has accelerated the technology development for a package having a size close to a chip size, and the demand for mounting reliability has underlined the importance for packaging technology capable of improving the efficiency of a mounting operation and the mechanical and electrical reliability after mounting.

Furthermore, as the high performance of electrical and electronic products has been demanded with the miniaturization of electrical and electronic products, a variety of technologies for providing a high-capacity semiconductor module have been researched and developed.

To provide a high-capacity semiconductor module, the high integration of memory chips is useful. The high integration may be realized by integrating a larger number of cells in a limited space of a semiconductor chip.

However, the high integration of memory chips requires a high-level technique and a large amount of development time. For example, a minute line width is useful. Therefore, stack technology has been proposed as another method for providing a high-capacity semiconductor module.

The stack technology may include building two stacked chips into one package and stacking two single packages. However, the stacking of two single packages has a limit to reducing the height of a semiconductor package with a miniaturization trend of electrical and electronic products.

Therefore, much research is being actively conducted on a stack package and a multi-chip package, in which two or more semiconductor chips are mounted in one package.

The multi-chip package may be typically fabricated by the following methods. First, several semiconductor chips may be simply arranged on a substrate and then packaged. Second, two or more semiconductor chips may be stacked in a multi-layered structure and then packaged.

As an example of the second method, a structure using a through silicon via (TSV) has been proposed. A package using the TSV is realized by the following process. First, a hole is formed in a semiconductor chip to pass through the semiconductor chip, and the hole is then filled with a conductive material to form a TSV. The upper and lower semiconductor chips are then coupled through the TSV.

FIG. 1 is a cross-sectional view illustrating a conventional semiconductor integrated circuit having a multi-chip structure using TSVs.

Referring to FIG. 1, a multi-chip package 10 using TSVs includes a plurality of semiconductor chips 12 and 14 stacked on a substrate. Here, each of the semiconductor chips 12 and 14 includes a plurality of TSVs 16 formed by filling holes passing through the semiconductor chips 12 and 14. Therefore, the semiconductor chips 12 and 14 are stacked in such a manner that the TSVs 16 disposed at the corresponding position are coupled to each other.

A plurality of bump pads 18 are formed over the semiconductor 12 so as to maintain a certain distance between the respective semiconductor chips 12 and 14. Therefore, the first semiconductor chip 12 where the TSVs 16 formed is coupled to the second semiconductor chip 14 through the bump pads 18. That is, the first and second semiconductor chips 12 and 14 are coupled through flip-chip bonding.

In the multi-chip package using the TSVs, the electrical coupling is achieved through the TSVs. Therefore, electrical degradation may be substantially prevented to increase the operation speed of the semiconductor chips, and the miniaturization may be achieved.

In the conventional semiconductor integrated circuit having a multi-chip structure, however, the TSVs are formed through the top side of a chip to the bottom side of the chip, and internal circuits of the respective chips are coupled to the TSVs in parallel. In this case, in order to control the voltage signal of the through electrode and apply the controlled voltage signal to another chip, another through electrode is required for only the controlled voltage signal.

Such an increase of the number of through electrodes may reduce the performance of the circuit in terms of area and fail rate. Furthermore, when different electrical signals are to be applied to the respective chips through the through electrodes, the chips need to have different structures. In this case, a separate patterning process should be performed. Accordingly, a mask for the pattering process should be separately formed. Therefore, a considerable amount of cost is required.

Furthermore, while the patterning process is performed, the position of the mask should be changed depending on the stack positions of the semiconductor chips. Therefore, the mass production efficiency decreases, and the cost inevitably increases.

SUMMARY OF THE INVENTION

An exemplary embodiment of the present invention is directed to a semiconductor integrated circuit having a multi-chip structure, which couples through silicon vias and internal circuits of semiconductor chips in series by using the through silicon via and internal metal paths.

In the exemplary embodiment of the present invention, because the through silicon vias and the internal circuits of semiconductor chips are coupled in series, different voltage signals may be applied to different semiconductor chips.

Another exemplary embodiment of the present invention is directed to a semiconductor integrated circuit having a multi-chip structure, which includes a serial coupling and a parallel coupling between internal circuits and through silicon vias of semiconductor chips.

In accordance with an exemplary embodiment of the present invention, a semiconductor integrated circuit having a multi-chip structure includes a plurality of stacked semiconductor chips. Here, at least one of the semiconductor chips includes first and second metal layers separately formed inside the semiconductor chip, a first internal circuit coupled in series between the first and second metal layers inside the semiconductor chip, a first metal path vertically formed over the second metal layer to a first side of the semiconductor chip, and a first through silicon via formed through the semiconductor chip from a second side of the semiconductor chip to the first metal layer.

In accordance with another exemplary embodiment of the present invention, a method for fabricating a semiconductor integrated circuit having a multi-chip structure includes forming first and second metal layers separately inside the semiconductor chip, and forming a first internal circuit coupled between the first and second metal layers, forming a first metal path over the second metal layer to a first side of the semiconductor chip, and forming a first trench by etching a second side of the semiconductor chip until the first metal layer is exposed, and forming a first through silicon via by filling the first trench.

DESCRIPTION OF SPECIFIC EMBODIMENTS

Figure 1:
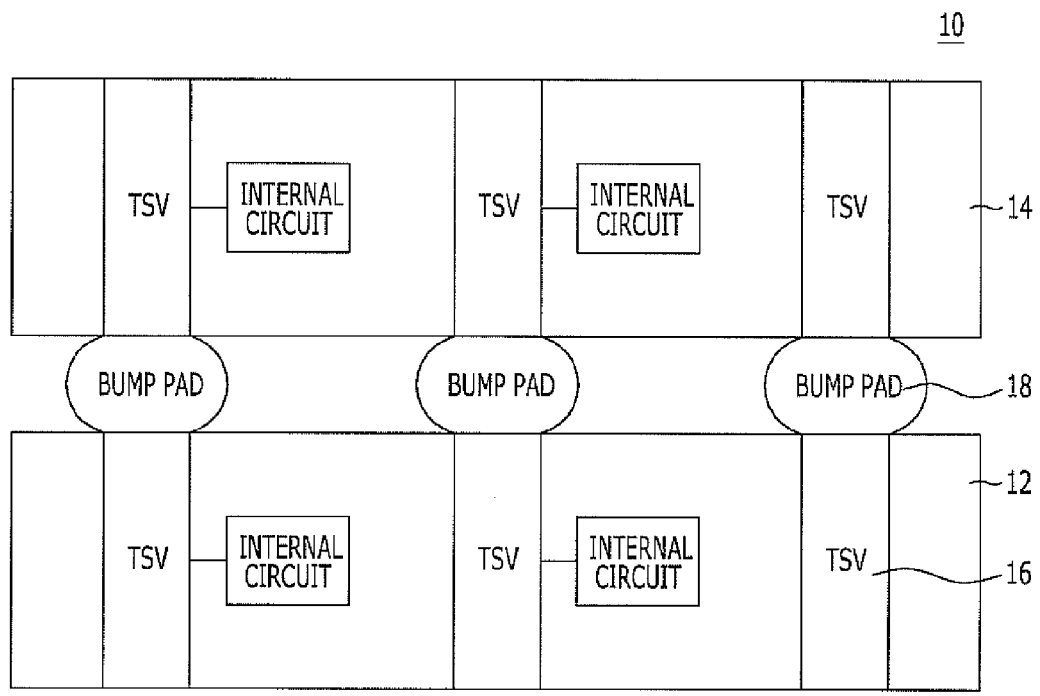
FIG. 1 is a cross-sectional view illustrating a conventional semiconductor integrated circuit having a multi-chip structure using TSVs.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
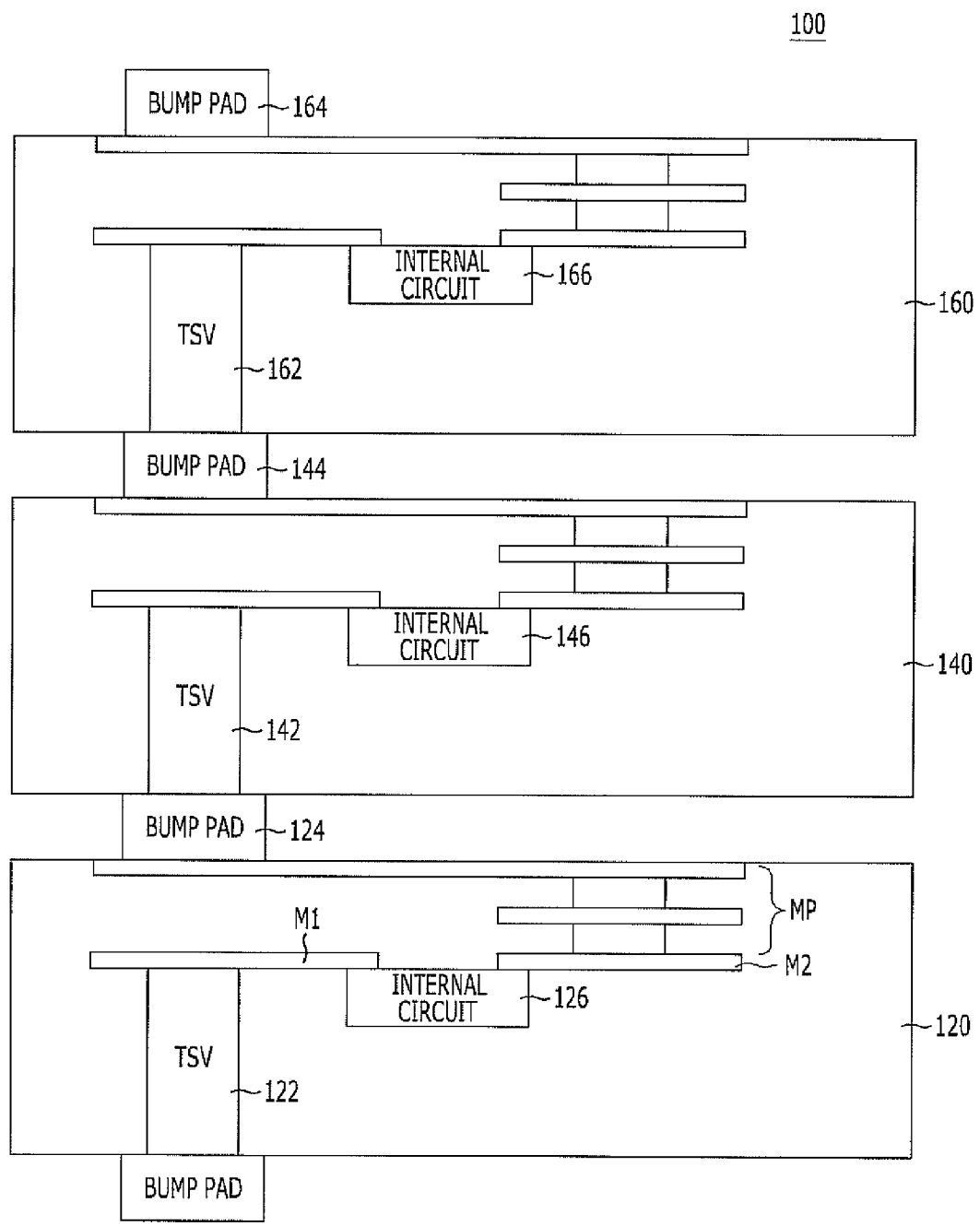
FIG. 2 is a cross-sectional view of a semiconductor integrated circuit having a multi-chip structure using TSVs in accordance with an embodiment of the present invention.

FIG. 2 is a cross-sectional view of a semiconductor integrated circuit having a multi-chip structure using Through Silicon Vias (TSVs) in accordance with an exemplary embodiment of the present invention.

Referring to FIG. 2, the semiconductor integrated circuit 100 having the multi-chip structure in accordance with this embodiment of the present invention includes a plurality of stacked semiconductor chips 120, 140, and 160.

The first semiconductor chip 120 includes a serial through silicon via 122, a first internal circuit 126, and a first bump pad 124. The second semiconductor chip 140 includes a serial through silicon via 142, a second internal circuit 146, and a first bump pad 144. Likewise, the third semiconductor chip 160 includes a serial through silicon via 162, a third internal circuit 166, and a first bump pad 164.

Hereafter, the configuration of the respective semiconductor chips will be described. In convenience of explanation, however, the following descriptions will be focused on the first semiconductor chip 120.

The first semiconductor chip 120 has a multi-layer structure comprising a plurality of layers. The first semiconductor chip 120 in accordance with this exemplary embodiment of the present invention includes a first metal layer M1 and a second metal layer M2 separately formed in a predetermined layer among the plurality of layers. Here, the first metal layer M1 and the second metal layer M2 may be formed on a same level, or on a different level. The first semiconductor chip 120 in accordance with this exemplary embodiment of the present invention further includes a metal path MP vertically formed over the second metal layer M2 to a first side of the first semiconductor chip 120. Here, the metal path MP comprises a plurality of metal lines and a plurality of metal contacts arranged between the respective metal lines. On the other hand, the metal path MP may comprise a through silicon via.

The first internal circuit 126 of the first semiconductor chip 120 is arranged in the first semiconductor chip 120, and the first internal circuit 126, for example, may receive an input signal, perform a designated operation, and output a signal. In particular, the first internal circuit 126 in accordance with this exemplary embodiment of the present invention is coupled between the first metal layer M1 and the second metal layer M2. Here, the first metal layer M1 and the second metal layer M2 may be formed on a same level, or on different levels.

The serial through silicon via 122 of the first semiconductor chip 120 is formed of a conductive material, and formed through the first semiconductor chip 120 from a second side of the first semiconductor chip 120 to the first metal layer M1.

The first bump pad 124 of the first semiconductor chip 120 is formed over the first side of the first semiconductor chip so as to maintain a predetermined distance between the semiconductor chips. In particular, the first bump pad 124 in accordance with this embodiment of the present invention is formed over the first side of the first semiconductor chip 120 at the same column region as the serial through silicon via 122. But, the first bump pad 124 may be formed at a different column region with the through silicon via 122. The first bump pad 124 is coupled to, for example, the nearest metal line to the first side, among the plurality of metal lines of the metal path MP. Accordingly, the first bump pad 124 of the first semiconductor chip 120 is not directly contacted with the serial through silicon via 122.

Although not illustrated, the semiconductor integrated circuit in accordance with this exemplary embodiment of the present invention may further include a substrate to which the stacked semiconductor chips are attached. Further, though FIG. 2 illustrates the semiconductor integrated circuit including three semiconductor chips, the semiconductor integrated circuit may include a larger or smaller number of semiconductor chips.

As described above, in this exemplary embodiment of the present invention, after the first metal layer M1 is formed, the hole, where the serial through silicon via 122 will be formed, is formed by using the first metal layer M1 as an etch stop layer, from the second side of the first semiconductor chip 120 to the first metal layer M1. Accordingly, the serial through silicon via 122 is not formed through the whole of the first semiconductor chip 120, but formed through a part of the first semiconductor chip 120.

Furthermore, in this exemplary embodiment of the present invention, the internal circuit 126 is coupled between the first metal layer M1 and the second metal layer M2, and is coupled to the first bump pad 124 through the metal path MP vertically formed over the second metal layer M2 to the first side of the first semiconductor chip 120. Here, the first bump pad 124 is formed over the first side of the first semiconductor chip 120 at the same column region as the serial through silicon via 122. But, the first bump pad 124 may be formed at a column region from the through silicon via 122.

As a result, the semiconductor integrated circuit has the multi-chip structure in which the TSV and the internal circuit of the semiconductor chip are coupled in series to the TSV, and the internal circuit of another semiconductor chip may be coupled in series to the TSV, and the internal circuit of the semiconductor chip. Therefore, the internal circuits of the semiconductor chips of the multi-chip package may be supplied with different voltages. Thus, a degree of freedom in design may increase.

Figure 3:
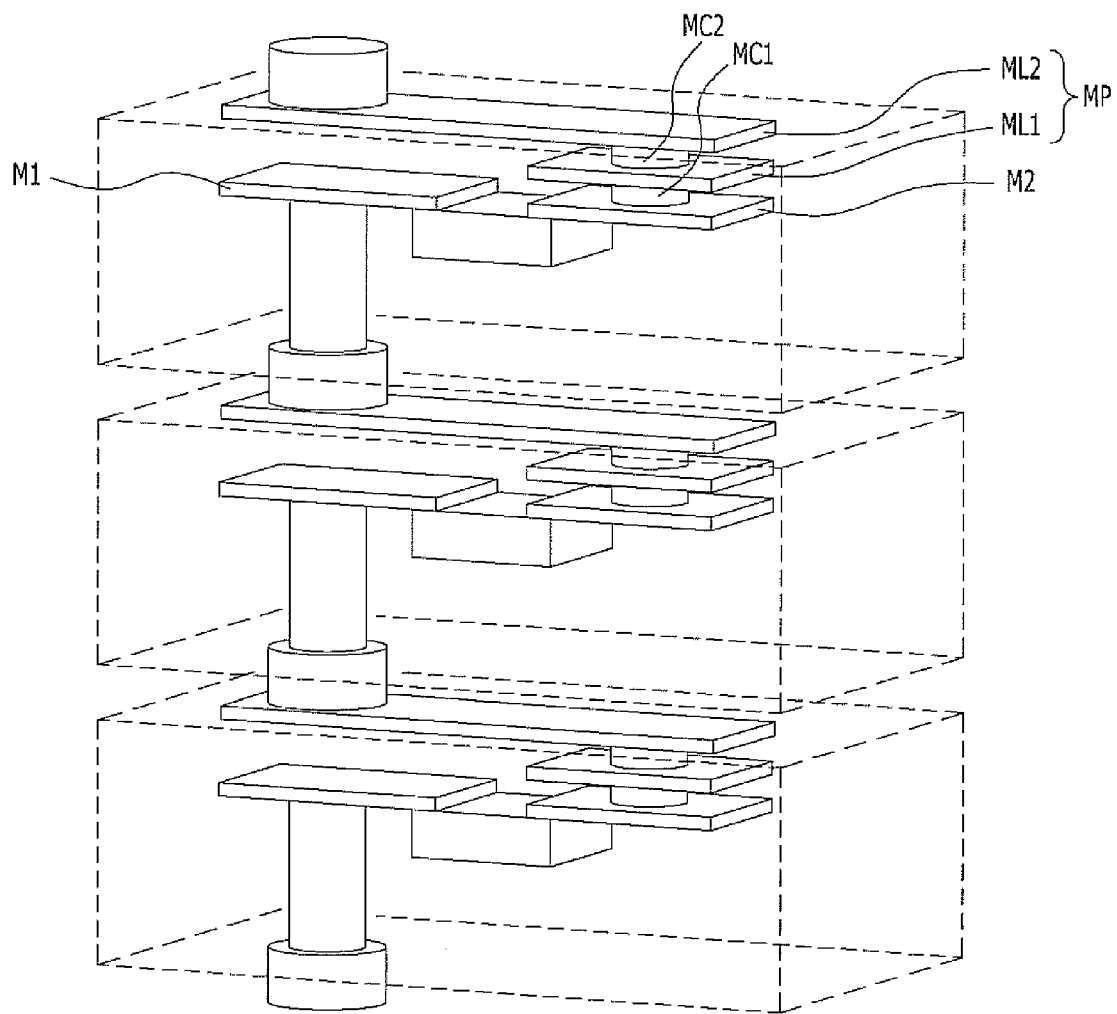
FIG. 3 is a three-dimensional diagram illustrating the semiconductor integrated circuit of FIG. 2 in more detail.

FIG. 3 is a three-dimensional diagram illustrating the semiconductor integrated circuit of FIG. 2 in more detail.

Referring to FIG. 3, the metal paths MP inside the semiconductor chip of the semiconductor integrated circuit having a multi-chip structure in accordance with this exemplary embodiment of the present invention includes a plurality of metal lines and a plurality of metal contacts arranged between the respective metal lines.

More specifically, the metal path MP includes first and second metal lines ML1 and ML2, and first and second metal contacts MC1 and MC2. The first metal line ML1 is formed on an upper layer of the second metal layer M2 which is formed in a specific layer of the semiconductor layer. The second metal line ML2 is formed on an upper layer of the first metal line ML1 to be coupled to the first bump pad. The first metal contact MC1 couples the second metal layer M2 with the first metal line ML1. The second metal contact MC2 couples the first metal line ML1 with the second metal line ML2.

Specifically, the second metal line ML2 may be positioned, for example, in the top layer of the semiconductor chip, and have a length such that the first bump pad is formed over the first side of the first semiconductor chip, for example, at the same column region as the serial through silicon via.

The metal path MP may be formed of any one of Cu and Al or an alloy of them. The serial through silicon via may be formed of any one of Sn, Ni, Cu, Au, and Al or an alloy of them.

Figure 4:
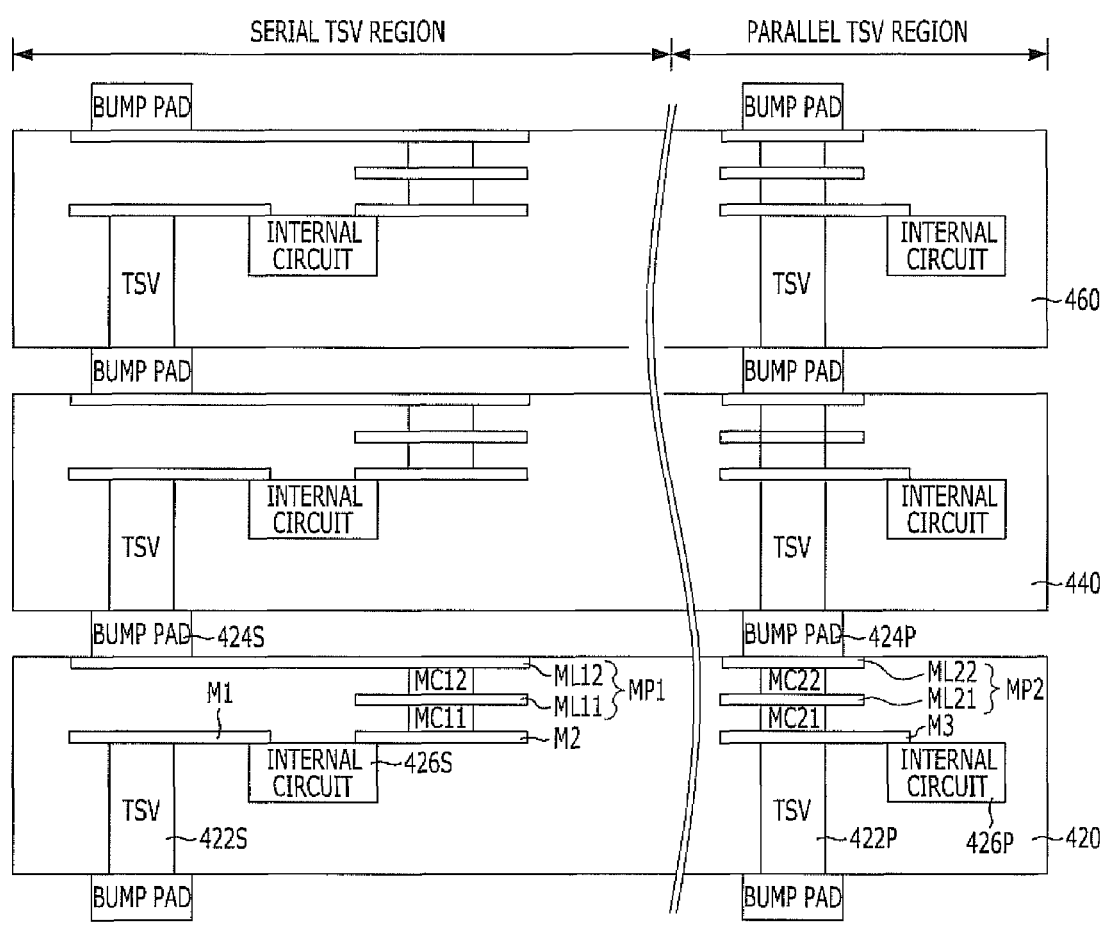
FIG. 4 is a cross-sectional view of a semiconductor integrated circuit having a multi-chip structure using TSVs in accordance with another embodiment of the present invention.

FIG. 4 is a cross-sectional view of a semiconductor integrated circuit having a multi-chip structure using TSVs in accordance with another exemplary embodiment of the present invention.

Referring to FIG. 4, the semiconductor integrated circuit 100 having the multi-chip structure in accordance with this exemplary embodiment of the present invention includes a plurality of stacked semiconductor chips 420, 440, and 460. Here, at least one of the semiconductor chips 420, 440, and 460 in accordance with this exemplary embodiment of the present invention includes a serial TSV region and a parallel TSV region. Therefore, internal circuits and through silicon vias may be coupled in series as well as in parallel between the respective semiconductor chips.

Since the second and third semiconductor chips 440 and 460 have the same configuration as the first semiconductor chip 420, the following descriptions will be focused on the first semiconductor chip 420.

The serial TSV region of the first semiconductor chip 420 includes a serial through silicon via 422S, a first bump pad 424S, and a first internal circuit 426S.

The first semiconductor chip 420 has a multi-chip structure comprising a plurality of layers, and a first metal layer M1 and a second metal layer M2 are separately formed. The first semiconductor chip 420 in accordance with this exemplary embodiment of the present invention further includes a first metal path MP1 which is vertically formed over the second metal layer M2 to a first side of the first semiconductor chip 420. Here, the first metal path MP1 comprises, for example, a plurality of metal lines, and a plurality of metal contacts provided between the respective metal lines.

The first internal circuit 426S is arranged in the first semiconductor chip 420 and configured to, for example, receive an input signal, perform a designated operation, and output a signal. In particular, the first internal circuit 426S in accordance with this exemplary embodiment of the present invention is coupled between the first metal layer M1 and the second metal layer M2.

The serial through silicon via 422S is formed through the first semiconductor chip 420 from a second side of the first semiconductor chip 420 to the first metal layer M1.

The first bump pad 424S is formed over the first semiconductor chip 420 so as to maintain a certain distance between the semiconductor chips. In particular, the first bump pad 424S in accordance with this exemplary embodiment of the present invention is formed over the first side of the first semiconductor chip 420, for example, at the same column region as the serial through silicon via 422S. The first bump pad 424S is coupled to, for example, the nearest metal line among the plurality of metal lines of the first metal path MP1.

In the serial TSV region of the first semiconductor chip 420 as described above, the first internal circuit 426S and the serial through silicon via 422S of the first semiconductor chip 420 are coupled to another first internal circuits and serial through silicon vias of another semiconductor chips positioned under and over the first semiconductor chip 420.

The parallel TSV region of the first semiconductor chip 420 includes a parallel through silicon via 422P, a second bump pad 424P, and a second internal circuit 426P.

In the parallel TSV region of the first semiconductor chip 420, a third metal layer M3 is arranged, for example, on the level where the first and second metal layers M1 and M2 are formed. Here, the third metal layer M3 is formed to be separate from the first and second metal layers M1 and M2. Further, a second metal path MP2 is vertically formed over the third metal layer M3 to the first side of the first semiconductor chip 420. Here, the second metal path MP2 comprises a plurality of metal lines, and a plurality of metal contacts provided between the respective metal lines. On the other hand, the second metal path MP2 may comprise a through silicon via.

The parallel through silicon via 422P is formed of a conductive material, and formed through the first semiconductor chip 420 from a second side of the first semiconductor chip 420 to the third metal layer M3.

The second internal circuit 426P is coupled to the parallel through silicon via 422P through the third metal layer M3. The second internal circuit 426P is configured, for example, to receive a signal inputted through the parallel through silicon via 422P, perform a designated operation, and output a signal.

The second bump pad 424P for maintaining a certain distance between the semiconductor chips is formed over the first side of the first semiconductor chip 420 so as to be contacted to the parallel through silicon via 422P through the second metal path MP2. Here, the second bump pad 424P is formed, for example, at the same column region as the parallel through silicon via 422P.

As described above, in the parallel TSV region of the first semiconductor chip 420, the second internal circuit 426P and the parallel through silicon via 422P of the first semiconductor chip 420 are coupled to the second internal circuit and the parallel through silicon via of the second semiconductor chip 440 through the second bump pad 424P.

As a result, the semiconductor integrated circuit may have a multi-chip structure in which the parallel through silicon via and the second internal circuit of the semiconductor chip are coupled in parallel.

Although not illustrated, the semiconductor integrated circuit in accordance with this exemplary embodiment of the present invention may further include a substrate to which the stacked semiconductor chips are attached. FIG. 4 illustrates the semiconductor integrated circuit including three semiconductor chips. However, the semiconductor integrated circuit may include a larger or smaller number of semiconductor chips.

As described above, the semiconductor integrated circuit in accordance with this exemplary embodiment of the present invention may support both the serial coupling and the parallel coupling of the internal circuits and the through silicon vias between the respective semiconductor chips. Therefore, the semiconductor integrated circuit may be designed in various structures.

FIGS. 5A to 5E are cross-sectional views illustrating a method for fabricating the semiconductor integrated circuit having a multi-chip structure using TSVs in accordance with another exemplary embodiment of the present invention.

Figure 5A:
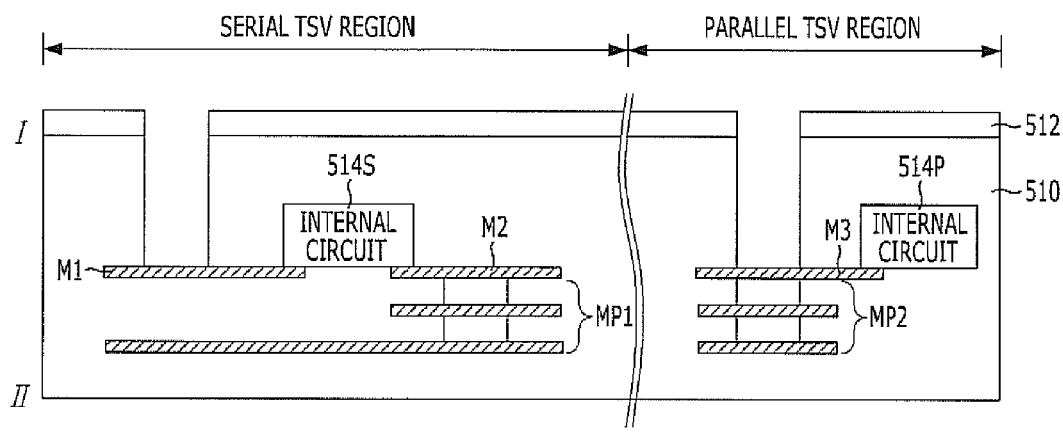
FIGS. 5A to 5E are cross-sectional views illustrating a method for fabricating the semiconductor integrated circuit having a multi-chip structure using TSVs in accordance with another embodiment of the present invention.

As shown in FIG. 5A, a semiconductor chip 510 is divided into a serial TSV region and a parallel TSV region. In the serial TSV region, a first metal layer M1, a second metal layer M2, a first internal circuit 514S, and a first metal path MP1 are arranged. The first and second metal layers M1 and M2 are separately formed. The first internal circuit 514S is formed to be coupled between the first metal layer M1 and the second metal layer M2. The first metal path MP1 is vertically formed over the second metal layer M2 to a second side (II) of the first semiconductor chip 510.

In the parallel TSV region, a third metal layer M3, a second internal circuit 514P, and a second metal path MP2 are arranged. The third metal layer M3 is formed, for example, in the level where the first and second metal layers M1 and M2 are formed. Here, the third metal layer M3 is formed to be separate from the first and second metal layers M1 and M2. The second internal circuit 514P is formed to be coupled to the third metal layer M3. The second metal path MP2 is vertically formed over the third metal layer M3 to the second side (II) of the semiconductor chip 510. Here, the first and second metal paths MP1 and MP2 comprise a plurality of metal lines, and a plurality of metal contacts provided between the respective metal lines. On the other hand, the metal path MP may comprise a through silicon via.

Referring to FIG. 5A, a mask pattern 512 is formed over the semiconductor chip, and a plurality of trenches are formed by etching the semiconductor chip 510 until the first and third metal layers M1 and M3 are exposed. Here, the first and third metal layers M1 and M3 are used as an etch stop layer.

Figure 5B:
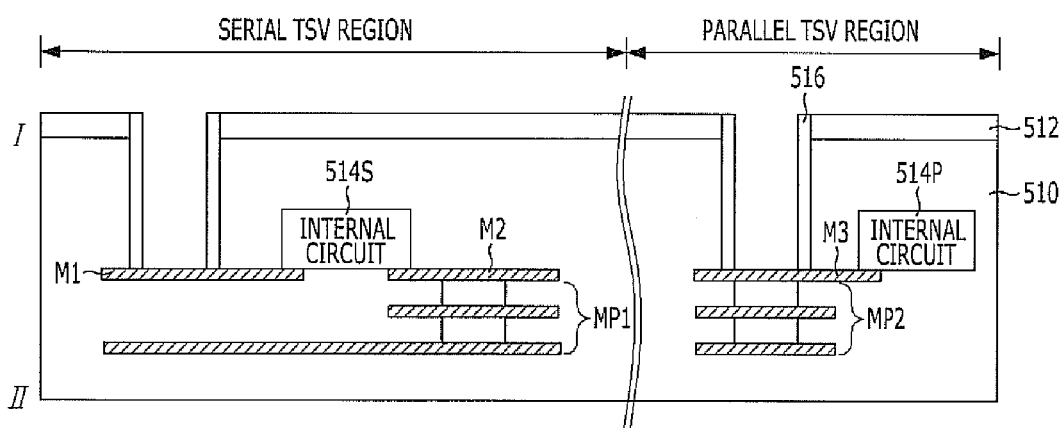

Referring to FIG. 5B, according to a example, an insulation layer is formed over the top surface of the semiconductor chip 510 including the top surfaces of the trenches, and an etch back process is performed in such a manner that the insulation layer remains, for example, only on the sidewalls of the trenches to form an insulation pattern 516. Here, the mask pattern 512 may be removed.

Figure 5C:
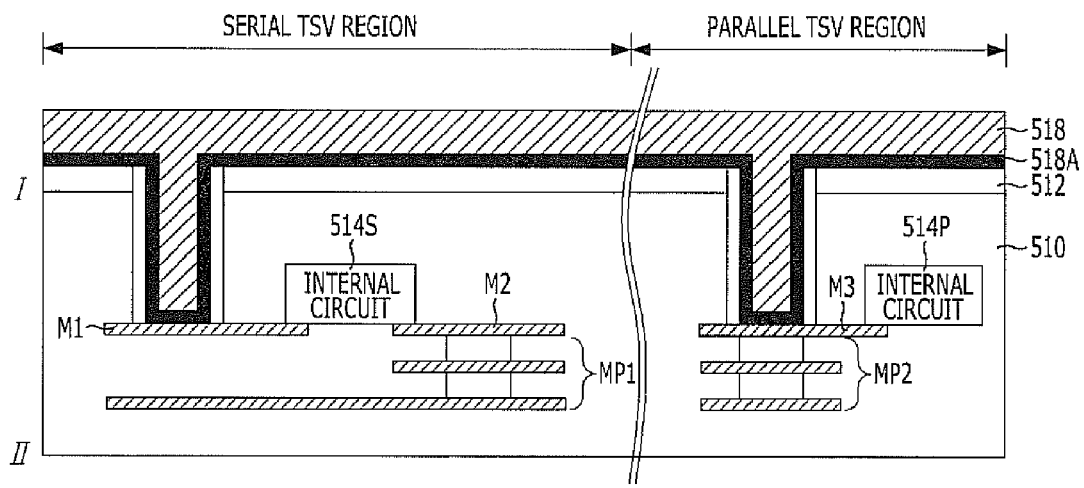

Referring to FIG. 5C, according to a example, a metal seed layer 518A is formed over the semiconductor chip 510 including the insulation pattern 516. A metal layer 518 is formed over the metal seed layer 518A such that the trenches are filled. The metal layer 518 may be formed of any one of Sn, Ni, Cu, Au, and Al or an alloy composed of one or more of the metals.

Figure 5D:
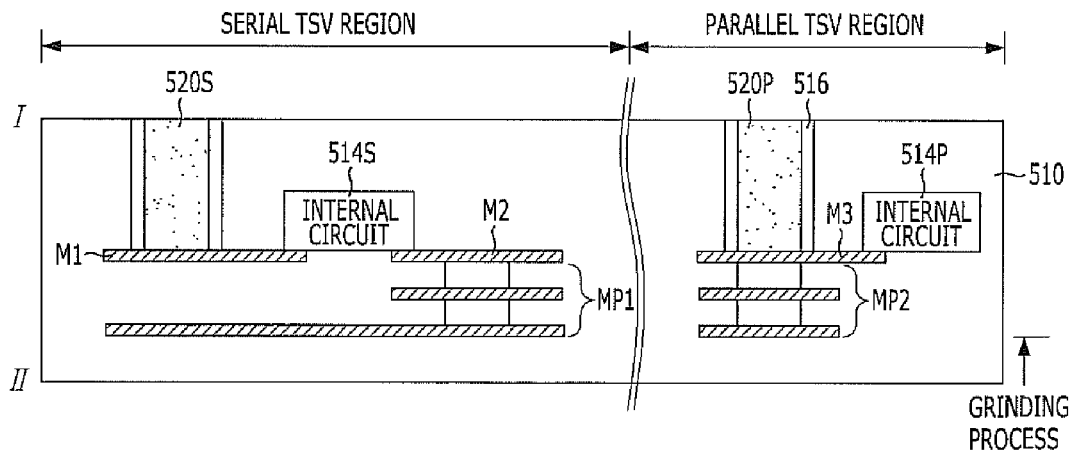

Referring to FIG. 5D, according to an example, an etch back process is performed over the metal layer. Accordingly, a serial through silicon via 520S is formed in the serial TSV region of the semiconductor chip 510 while a parallel through silicon via 520P is formed in the parallel TSV region of the semiconductor chip 510.

Thereafter, at least one or more of a grinding process and an etching process may be performed to the second side of the semiconductor chip 510 such that the serial through silicon via 520S and the parallel through silicon via 520P are exposed.

Figure 5E:
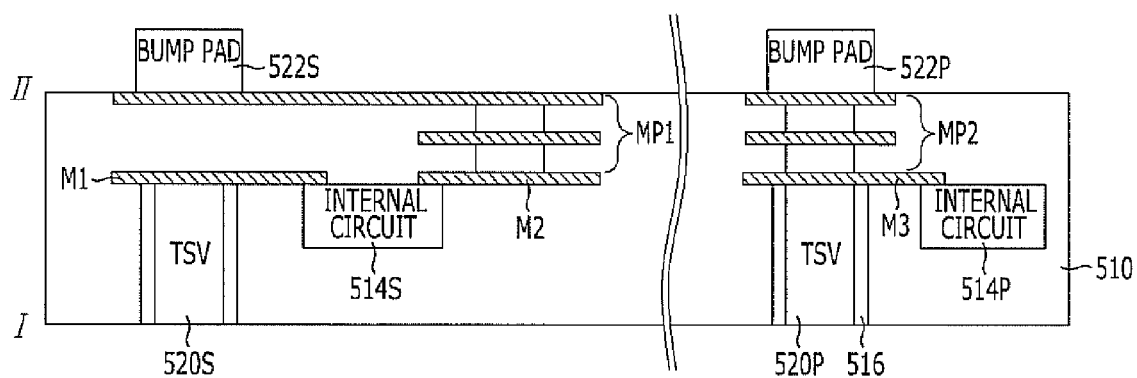

In the FIG. 5E, for illustration purposes, the resultant structure is depicted upside down from a I-II direction to a II-I direction.

Referring to FIG. 5E, in the serial TSV region of the semiconductor chip 510, a first bump pad 522S is formed over the semiconductor chip 510, for example, at the same column region as the serial through silicon via 520S so as to be coupled the first metal path MP1. In the parallel TSV region of the semiconductor chip 510, a second bump pad 522P is formed over the semiconductor chip 510, for example, at the same column region as the parallel through silicon via 520P so as to be coupled the second metal path MP2. Here, the serial through silicon via 520S and the first bump pad 522S are formed to be symmetrical with the parallel through silicon via 520P and the second bump pad 522P, respectively.

In the semiconductor integrated circuit having a multi-chip structure in accordance with the exemplary embodiments of the present invention, the through silicon vias and the internal circuits of the respective semiconductor chips may be coupled in series or in parallel. Therefore, different voltage signals may be applied to different internal circuits of a package, and a degree of freedom in design may increase.

Furthermore, since the through silicon vias of the respective semiconductor chips do not need to be aligned accurately, an entire process time may decrease.

While the present invention has been described with respect to the specific embodiments, it will be apparent to those skilled in the art that various changes and modifications may be made without departing from the spirit and scope of the invention as defined in the following claims.

What is claimed is:

1. A semiconductor integrated circuit having a multi-chip structure, comprising a plurality of stacked semiconductor chips, wherein at least one of the semiconductor chips comprises:
   first and second metal layers separately formed inside the semiconductor chip;
   a first internal circuit coupled in series between the first and second metal layers inside the semiconductor chip;
   a first metal path vertically formed over the second metal layer to a first side of the semiconductor chip;
   a first through silicon via formed through the semiconductor chip from a second side of the semiconductor chip to the first metal layer; and
   a first bump pad formed over the semiconductor chip to couple a first through silicon via of another semiconductor chip and the first metal path of the semiconductor chip.

2. The semiconductor integrated circuit of claim 1, wherein the first bump pad is formed at substantially the same column region as first through silicon via.

3. The semiconductor integrated circuit of claim 1, wherein the first internal circuit and the first through silicon via of the semiconductor chip are coupled in series to the first internal circuit and the first trough electrode of another semiconductor chip.

4. The semiconductor integrated circuit of claim 1, wherein the semiconductor chip further comprises:
- a third metal layer formed to be separate from the first and second metal layers;
- a second internal circuit coupled in parallel to the third metal layer;
- a second metal path vertically formed over the third metal layer to the first side of the semiconductor chip;
- a second through silicon via formed through the semiconductor chip from the second side of the semiconductor chip up to the third metal layer; and
- a second bump pad formed to couple a second through silicon via of another semiconductor chip and the second metal path of the semiconductor chip.

5. The semiconductor integrated circuit of claim 4, wherein the second through silicon via of the semiconductor chip are coupled in series to the second through silicon via of another semiconductor chip.

6. The semiconductor integrated circuit of claim 4, wherein the second bump pad is formed at the same column region as the second through silicon via.

7. The semiconductor integrated circuit of claim 6, wherein the first through silicon via and the first bump pad are symmetrical with the second through silicon via and the second bump pad.

8. The semiconductor integrated circuit of claim 4, wherein each of the first and second metal paths comprises a plurality of metal lines and a plurality of metal contacts arranged between the respective metal lines.

9. The semiconductor integrated circuit of claim 4, wherein each of the first and second metal paths is formed of one via.

* * * * *